United States Patent
Jeong et al.

(10) Patent No.: US 11,695,281 B2
(45) Date of Patent: *Jul. 4, 2023

(54) BATTERY OVERCHARGING PREVENTION DEVICE AND BATTERY OVERCHARGING PREVENTION METHOD USING SAME

(71) Applicant: SK ON CO., LTD, Seoul (KR)

(72) Inventors: Soo Jeong Jeong, Daejeon (KR); Yun Nyoung Lee, Daejeon (KR)

(73) Assignee: SK ON CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/515,878

(22) Filed: Nov. 1, 2021

(65) Prior Publication Data
US 2022/0069607 A1 Mar. 3, 2022

Related U.S. Application Data

(63) Continuation of application No. 16/082,357, filed as application No. PCT/KR2017/002434 on Mar. 7, 2017, now Pat. No. 11,196,273.

(30) Foreign Application Priority Data

Mar. 8, 2016 (KR) .................. 10-2016-0027899
Mar. 6, 2017 (KR) .................. 10-2017-0028421

(51) Int. Cl.
*H02J 7/00* (2006.01)
*G01R 31/382* (2019.01)
*B60L 58/10* (2019.01)
*G01R 19/165* (2006.01)
*H02H 7/18* (2006.01)

(52) U.S. Cl.
CPC .......... *H02J 7/00302* (2020.01); *B60L 58/10* (2019.02); *G01R 19/165* (2013.01); *G01R 31/382* (2019.01); *H02H 7/18* (2013.01); *H02J 7/0014* (2013.01); *H02J 7/0031* (2013.01); *H02J 2310/48* (2020.01)

(58) Field of Classification Search
CPC .................................................. H02J 7/00302
USPC ........................................................ 320/134
See application file for complete search history.

(56) References Cited

U.S. PATENT DOCUMENTS

| | | | | |
|---|---|---|---|---|
| 11,196,273 | B2 * | 12/2021 | Jeong | ............... G01R 19/165 |
| 2001/0052759 | A1 * | 12/2001 | Sakurai | ............... H02J 7/0031 |
| | | | | 320/134 |
| 2016/0056646 | A1 * | 2/2016 | Lee | ............... B60L 1/00 |
| | | | | 320/163 |

(Continued)

*Primary Examiner* — Yalkew Fantu
(74) *Attorney, Agent, or Firm* — IP & T Group LLP

(57) ABSTRACT

A battery overcharge preventing device according to an embodiment of the present invention includes: a voltage distribution unit connected to both ends of at least one battery cell in a battery module including multiple battery cells, the voltage distribution unit being configured to distribute a voltage of the at least one battery cell according to a preset ratio; a voltage sensing unit operating so as to allow a control current to flow when the voltage distributed by the voltage distribution unit is greater than a preset reference voltage; and a second relay configured to block, by operation of the voltage sensing unit, operation of a first relay that establishes an electrical connection between the battery module and a charging module.

11 Claims, 7 Drawing Sheets

(56) References Cited

U.S. PATENT DOCUMENTS

2016/0099591 A1* 4/2016 Lee ................ H02J 7/0031
                                              320/162
2016/0156205 A1* 6/2016 Lee ................ H01M 10/441
                                              320/112
2016/0204632 A1* 7/2016 Kleine ................ H02J 7/34
                                              320/134

* cited by examiner

BATTERY OVERCHARGING PREVENTION DEVICE AND BATTERY OVERCHARGING PREVENTION METHOD USING SAME

CROSS REFERENCE TO RELATED APPLICATIONS

This application is a continuation of U.S. patent application Ser. No. 16/082,357, filed on Sep. 5, 2018, which is a National Phase Entry Application from PCT/KR2017/002434 filed Mar. 7, 2017, claiming priority from Korean Patent Application No. 10-2016-0027899 filed Mar. 8, 2016 and No. 10-2017-0028421 filed Mar. 6, 2017, all of which are incorporated herein in their entireties by reference.

BACKGROUND OF THE INVENTION

Technical Field

The present invention relates to a battery overcharging prevention device.

Background Art

As well known in the art, a lithium ion battery module, though intended to be recharged after being discharged and to be reused, has potential drawbacks of explosion or ignition when overcharged beyond a predetermined voltage. Furthermore, a battery module typically includes at least one battery cell to satisfy design specifications. Because of this, in the case where one of battery cells included in the battery module is overcharged and thus explodes or ignites, not only the overcharged battery cell itself but also neighboring other battery cells are adversely affected, leading to deterioration in durability of the entire battery module. Thus, it is essentially required to prevent the battery module from being overcharged in order to secure safety of a user as well as durability of the battery module.

Documents of Related Art (Patent Document 1) JP 2014-30281 A

Technical Problem

Accordingly, the present invention has been made keeping in mind the above problem occurring in the related art, and an objective of the present invention is to provide a battery overcharging prevention device and a battery overcharging prevention method, wherein it is determined whether a battery module is overcharged based on a voltage of a battery cell and an electrical connection between the battery module and a charging module is cut off when the battery is determined to be overcharged.

Another objective of the present invention is to provide a battery overcharging prevention device and a battery overcharging prevention method, wherein a voltage is detected only when a vehicle ignition is on to minimize power consumption, thereby reducing a difference in the voltage between cells and preventing lifespan of a battery from being shortened.

BRIEF SUMMARY OF THE INVENTION

Technical Solution

In order to accomplish the above objectives, according to one aspect of the present invention, there is provided a battery overcharging prevention device, including: a voltage distribution unit connected to both ends of at least one battery cell in a battery module including multiple battery cells, the voltage distribution unit being configured to distribute a voltage of the at least one battery cell according to a preset ratio; a voltage sensing unit operating so as to allow a control current to flow when the voltage distributed by the voltage distribution unit is greater than a preset reference voltage; and a second relay configured to block, by operation of the voltage sensing unit, operation of a first relay that establishes an electrical connection between the battery module and a charging module.

Furthermore, the second relay may be located on a path through which a first driving current for driving the first relay is transmitted, and there may be included a relay driver generating a second driving current, which is greater than the control current and is equal to or greater than an operating current of the second relay, using the control current and applying the generated second driving current to the second relay.

Furthermore, the voltage distribution unit may include: a first resistor connected to a positive electrode of the battery cell; and a second resistor connected to a negative electrode of the battery cell, wherein the first resistor and the second resistor may be connected in series to each other.

Furthermore, the first resistor may have a resistance of 150 kΩ to 300 kΩ, and the second resistor may have a resistance of 86.5 kΩ to 875.6 kΩ.

Furthermore, the voltage sensing unit may be a shunt regulator that is turned on when the distributed voltage applied to a reference terminal is equal to or greater than the reference voltage to allow the control current to flow.

Furthermore, the relay driver may include: a third resistor generating a bias voltage by receiving the control current flowing in the voltage sensing unit; and a transistor turned on when the bias voltage is applied to a drive terminal to apply the second driving current to a second coil of the second relay.

Furthermore, the control current may have a magnitude of 1 mA to 25 mA, and the second driving current may have a magnitude of 25 mA to 500 mA.

Furthermore, even when the second relay receives the second driving current applied to cut off the path of the first driving current and then is switched to a state in which the second driving current is not applied, the second relay may maintain a state of cutting off the path of the first driving current.

Furthermore, there may be further included a third relay connected between the battery cell and the overcharging prevention circuit and connecting or disconnecting the battery cell to or from the overcharging prevention circuit based on an ignition signal applied from a vehicle.

Furthermore, the ignition signal may be not applied when a vehicle ignition is off but be applied when the vehicle ignition is on.

According to another aspect of the present invention, there is provided a battery overcharging prevention method, including: a first step of determining whether a battery module is overcharged by using a voltage sensing unit sensing a voltage of a battery cell; and a second step of when the battery module is determined to be overcharged, cutting off a connection between the battery module and a charging module by applying a second driving current to a second relay connected to a path of a first driving current applied to a first relay connecting the battery module and the charging module to each other.

Furthermore, the first step may include: distributing the voltage of the battery cell using multiple resistors connected in series to each other; and sensing, by the voltage sensing unit, the distributed voltage of the battery cell, and determining that the battery module is overcharged when the distributed voltage of the battery cell is equal to or greater than a preset reference voltage.

Furthermore, the second step may include: when the battery module is determined to be overcharged, generating a bias voltage by allowing a control current generated by the voltage sensing unit to be applied to a third resistor; applying the bias voltage to a base terminal of a transistor to turn on the transistor, thereby applying the second driving current to the second relay; and operating the second relay to which the second driving current is applied to cut off the path of the first driving current applied to the first relay and opening the first relay to which the first driving current is not applied.

The battery overcharging prevention method may further include when an ignition signal is applied from a vehicle, allowing the third relay connected between the battery cell and the overcharging prevention circuit to be shorted and when the ignition signal is not applied from the vehicle, allowing the third relay to be opened.

Advantageous Effects

According to the embodiment of the present invention, upon battery module charging, it is determined whether the battery module is overcharged based on the voltage of the battery cell, and the connection between the battery module and the charging module is cut off when the battery module is determined to be overcharged, whereby it is possible to secure durability and stability of the battery module.

Furthermore, according to the embodiment of the present invention, there is included the overcharging prevention circuit that operates independently of the battery management system (BMS), whereby it is possible to prevent the battery module from being overcharged even when the battery management system (BMS) malfunctions or is damaged.

Furthermore, according to the embodiment of the present invention, the magnitude of the distributed voltage of the battery cell is adjusted based on the ratio of resistance values of resistors included in the voltage distribution unit, whereby it is possible to employ various types of voltage sensing units to which the distributed voltage of the battery cell is applied.

Furthermore, according to the embodiment of the present invention, the second driving current for driving the second relay is generated and amplified through the transistor, whereby it is possible to employ the low voltage shunt regulator as the voltage sensing unit to thereby minimize the power consumed by the overcharging prevention circuit.

Furthermore, according to the embodiment of the present invention, the voltage of the battery cell is detected only when the vehicle ignition is on to minimize power consumption, whereby it is possible to reduce the difference in the voltage between the cells to thereby prevent the lifespan of the battery from being shortened.

DETAILED DESCRIPTION OF THE INVENTION

Best Mode

Figure 1:
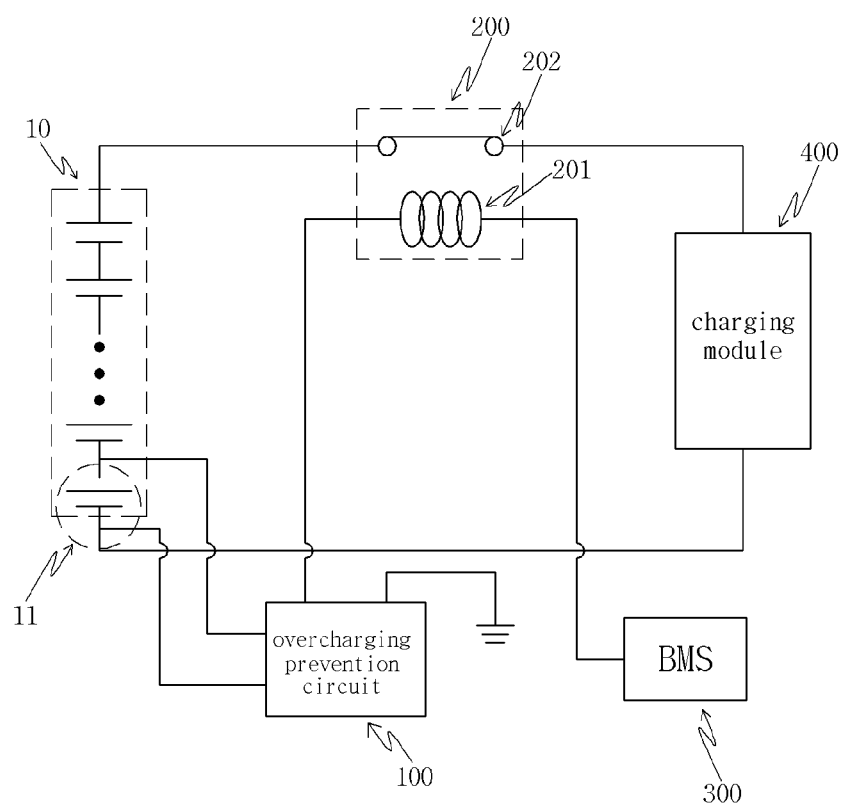
FIG. 1 is a block diagram showing a battery overcharging prevention device according to an embodiment of the present invention.

The above and other objectives, features, and other advantages of the present invention will be more clearly understood from the following detailed description when taken in conjunction with the accompanying drawings. As for reference numerals associated with parts in the drawings, the same reference numerals will refer to the same or like parts through the drawings. It will be understood that, although the terms "one side", "the other side", "first", "second", etc. may be used herein to describe various elements, these elements should not be limited by these terms. These terms are only used to distinguish one element from another element. Hereinbelow, in the description, details of well-known features and techniques may be omitted to avoid unnecessarily obscuring the presented embodiments.

Hereinafter, exemplary embodiments of the present invention will be described in detail with reference to the accompanying drawings.

Figure 2:
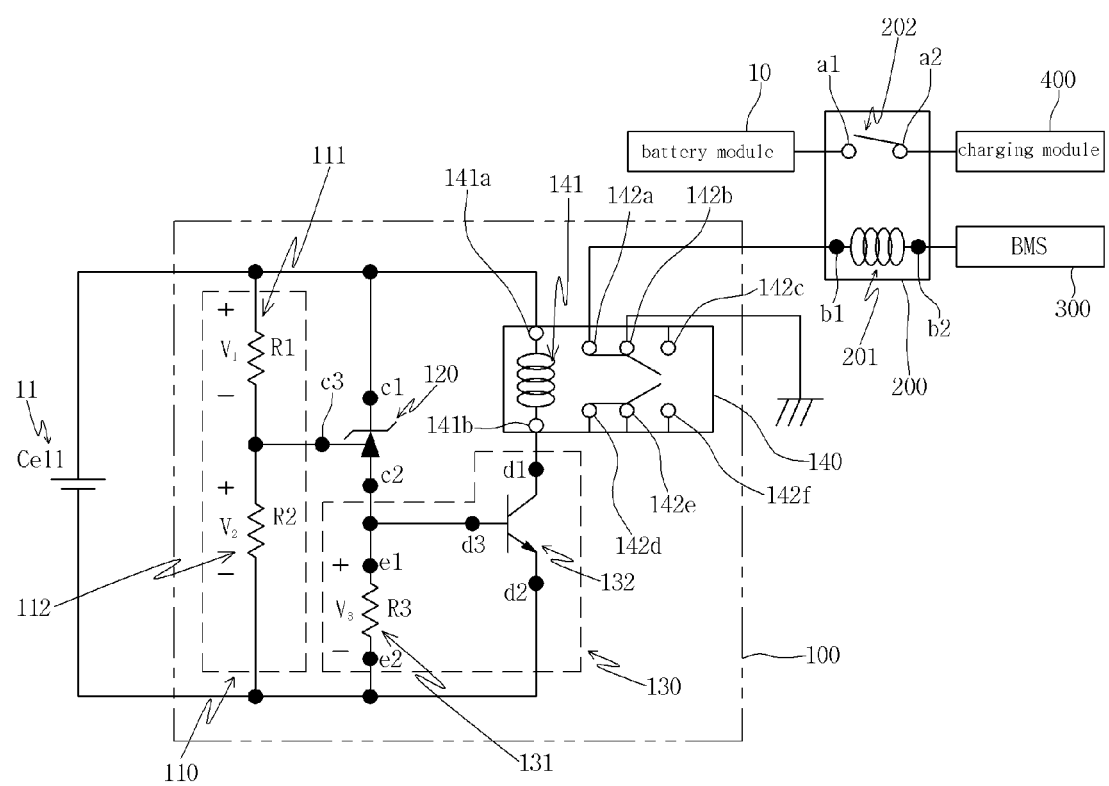
FIG. 2 is a circuit diagram showing an overcharging prevention circuit of FIG. 1.

FIG. 1 is a block diagram showing a battery overcharging prevention device according to an embodiment of the present invention, and FIG. 2 is a circuit diagram showing an overcharging prevention circuit of FIG. 1.

A battery overcharging prevention device according to an embodiment of the present invention includes a voltage distribution unit 110 connected to both ends of at least one battery cell 11 in a battery module 10 including multiple battery cells 11, the voltage distribution unit being configured to distribute a voltage of the at least one battery cell 11 according to a preset ratio, a voltage sensing unit 120 operating so as to allow a control current to flow when the voltage distributed by the voltage distribution unit is greater than a preset reference voltage, and a second relay 140 configured to block, by operation of the voltage sensing unit 120, operation of a first relay 200 that establishes an electrical connection between the battery module 10 and a charging module 400.

The battery module 10 includes at least one battery cell 11 connected in series. Furthermore, the battery module 10 is electrically connected with the charging module 400 by the first relay 200, and is charged using the charging module 400.

The charging module 400 charges the battery module 10 through the first relay 200. The charging module 400 includes a vehicle power supply device or the like. For example, the charging module 400 may include an inverter and a motor provided in an electric vehicle. In this case, the battery module 10 can be charged in a manner that kinetic energy of an electric vehicle or a hybrid vehicle is converted into electric energy using regenerative braking. However, the charging module 400 is not limited thereto and is applicable to the embodiment of the present invention as long as it can charge the battery module 10.

The first relay 200 is connected between the battery module 10 and the charging module 400 and is configured to control inflow of a charging current flowing from the charging module 400 into the battery module 10.

The first relay may be configured as a power relay assembly (PRA) including a first main relay (+), a second main relay (−), a pre-charge relay, and a pre-charge resistor. The first main relay (+) is connected to a positive terminal of the battery module 10 and the second main relay (−) is connected to a negative terminal of the battery module 10, such that the electrical connection between the battery module 10 and the charging module 400 is cut off.

The pre-charge resistor and the pre-charge relay are configured to allow a current output from the battery module 10 to be pre-charged prior to application to the first main relay (+). This makes it possible to prevent arc discharge which may occur at the time of direct connection to the first main relay, thereby securing stability of a circuit. Herein, the pre-charge relay may be connected in parallel with the first main relay (+) while the pre-charge resistor may be connected in series with the pre-charge relay. Each relay of the power relay assembly may be controlled by a battery management system (BMS).

In order to clarify the contents of the present invention, the first relay is simplified as a relay having a coil and a switch. The first relay 200 includes a first switch 202 and a first coil 201. Specifically explained, a first end a1 of the first switch 202 is connected to the battery module 10 while a second end a2 thereof is connected to the charging module 400. When a first driving current $I_1$ flows into the first coil 201, the first switch 202 is turned on to permit the charging current to flow from the charging module 400 to the battery module 10. Conversely, when the first driving current $I_1$ does not flow into the coil, the switch is turned off and thus the electrical connection between the charging module 400 and the battery module 10 is cut off to block inflow of the charging current. Thus, whether the battery module 10 is charged or not is determined depending on whether the first driving current $I_1$ for driving the first relay 200 flows through the first coil 201.

Herein, a first end b1 of the first coil 201 is connected to the overcharging prevention circuit 100 while a second end b2 of the first coil 201 is connected to the battery management system (BMS) 300. The battery management system 300 monitors a state of the battery module 10 to control generation of the first driving current $I_1$.

Hereinbelow, the battery management system 300 will be described as an example. However, the battery overcharging prevention device according to the embodiment of the present invention operates independently from the battery management system (BMS) irrespective of normal operation or malfunction of the battery management system (BMS) or other control devices. Thus, the second end b2 of the first coil 201 may be connected to other control devices capable of controlling charging of the battery module 10 in addition to the battery management system 300. In some cases, the second end b2 of the first coil 201 may be directly connected to a 12V power source such that the battery module 10 and the charging module 400 are connected to each other at all times. Thus, the battery overcharging prevention device according to the embodiment of the present invention is advantageous in that the battery overcharging prevention device can operate normally even when the control devices such as the battery management system (BMS) malfunction, thereby preventing a battery from being overcharged.

Specifically explained, the battery management system 300 monitors state of charge of the battery module 10, generates the first driving current $I_1$ to flow into the first coil 201 when the battery module is determined to be in a normal state, and stops generation of the first driving current $I_1$ to stop charging of the battery module 10 when the battery module is determined to be overcharged.

The battery management system 300 determines whether the battery module 10 is overcharged depending on occurrence of a swelling phenomenon in which the battery swells upon overcharging. However, the swelling phenomenon may occur irregularly depending on characteristics of the battery module 10, and it is difficult to accurately determine whether the battery module 10 is overcharged. In addition, in order to add various functions to the battery management system 300, the battery management system 300 has been further refined and integrated. Accordingly, there is a high possibility that the battery management system 300 malfunctions and is easily damaged due to an external impact applied thereto. Accordingly, when the battery management system 300 malfunctions or is damaged, the battery module 10 may be overcharged and thus have a risk of explosion.

Thus, in order to accurately control the first driving current $I_1$, the embodiment of the present invention includes an overcharging prevention circuit 100 in addition to the battery management system 300, thereby effectively preventing the case where the battery module 10 is overcharged and thus explodes.

The overcharging prevention circuit 100 compares the distributed voltage of the battery cell 11 with a preset reference voltage $V_R$ to determine whether the battery module is overcharged and, when the battery module is determined to be overcharged, generates and amplifies a second driving current $I_2$ for driving the second relay 140 that is electrically connected to the first coil 201 of the first relay 200, thereby controlling the first driving current $I_1$ for driving the first relay 200. In other words, the overcharging prevention circuit 100 senses the voltage of the battery cell 11 to determine whether the battery module is overcharged and, when the battery module is determined to be overcharged, controls the first driving current $I_1$ by using the second relay 140 that is connected to the first end b1 of the first coil 201.

The second relay 140 is located on a path through which the first driving current $I_1$ for driving the first relay 200 is transmitted. The second relay 140 includes a second coil 141 and a second switch 142, wherein a first terminal 142a of the second switch 142 and the first end b1 of the first coil 201 are connected to each other while a second terminal 142b of the second switch 142 and a ground are connected to each other.

Specifically explained, the overcharging prevention circuit 100 generates and amplifies the operating current of the second relay 140 to flow into the second coil 141 of the second relay 140 when the battery module is determined to be overcharged. Accordingly, the second switch 142 included in the second relay 140 is turned on to open the path of the first driving current $I_1$. As a result, the first switch 202 is opened and thus charging of the battery module 10 is stopped. Accordingly, even when the battery management system malfunctions to generate the first driving current $I_1$, the overcharging prevention circuit 100 cuts off the path of the first driving current $I_1$, thereby preventing the battery module 10 from being overcharged. Due to this, it is possible to improve durability of the battery module 10 and to secure stability thereof.

Figure 3:
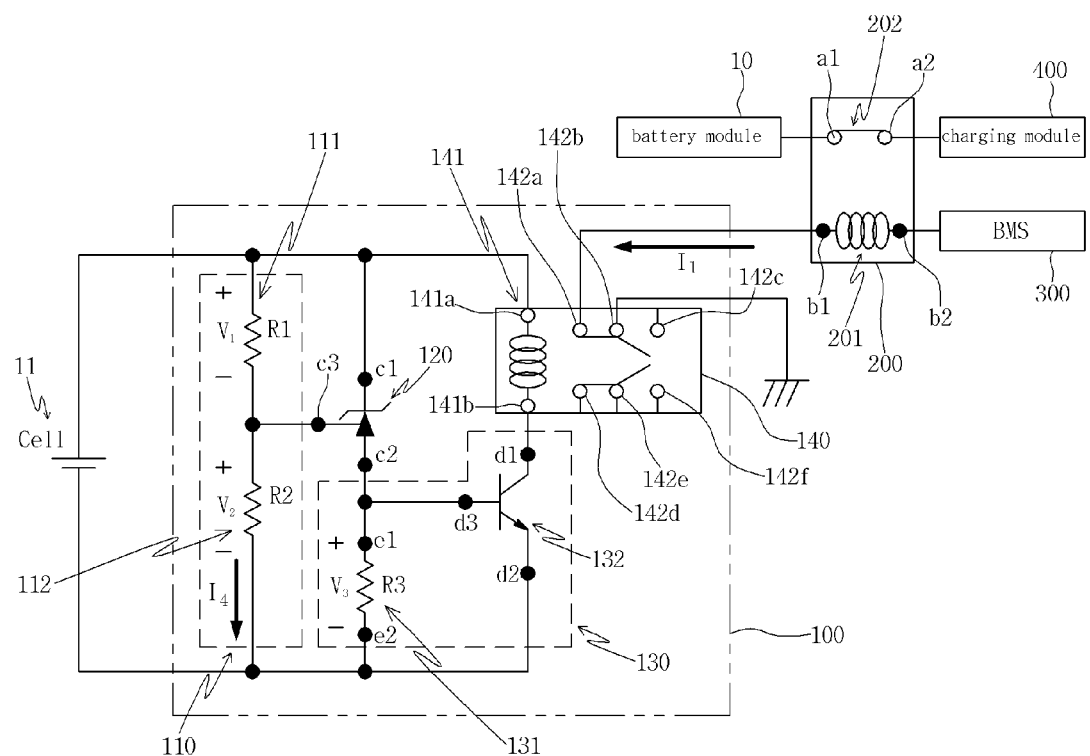
FIG. 3 is a view showing flows of a current in the overcharging prevention circuit and a first driving current of a first relay when a battery cell is in a normal state.
Figure 4:
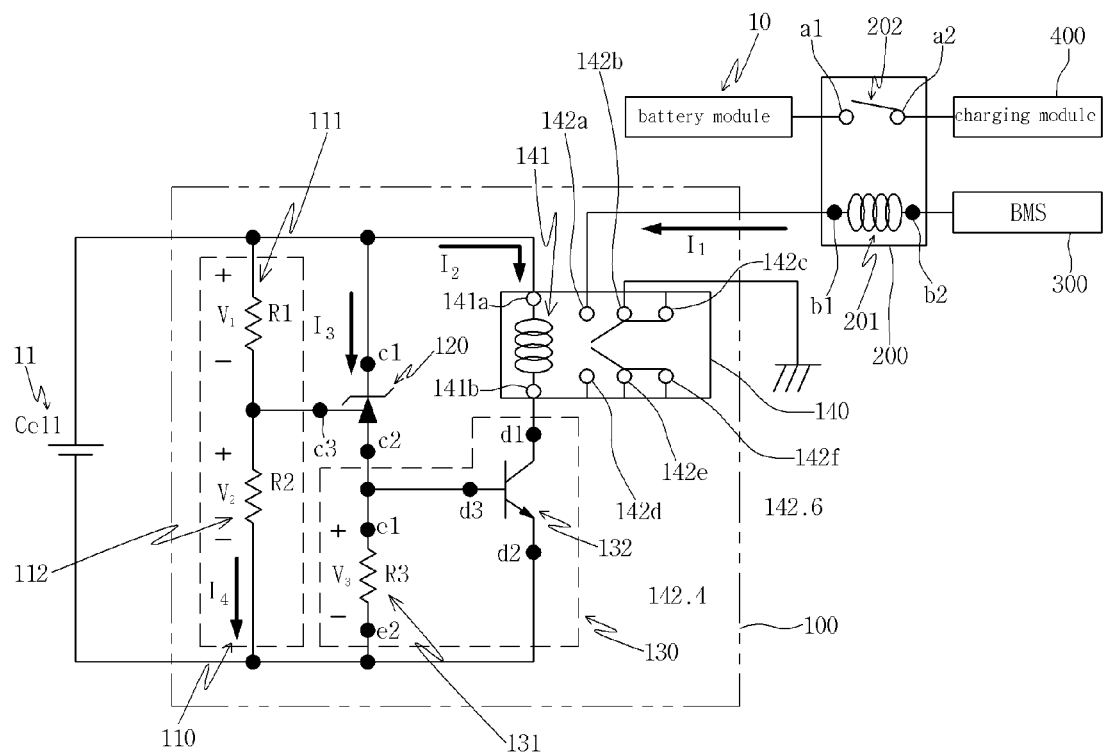
FIG. 4 is a view showing flows of the current in the overcharging prevention circuit and the first driving current of the first relay when the battery cell is in an overcharged state.

FIG. 2 is a circuit diagram showing the overcharging prevention circuit 100, FIG. 3 is a view showing flows of the current in the overcharging prevention circuit 100 and the first driving current of the first relay 200 when the battery cell 11 is in a normal state. Additionally, FIG. 4 is a view showing flows of the current in the overcharging prevention circuit 100 and the first driving current of the first relay 200 when the battery cell 11 is in an overcharged state. The configuration and operating method of the overcharging prevention circuit 100 will be described in detail with reference to FIGS. 2 to 4.

As shown in FIG. 2, the overcharging prevention circuit 100 includes the second relay 140, the voltage distribution unit 110, the voltage sensing unit 120, and a relay driver 130.

The voltage distribution unit 110 includes multiple resistors connected in series and is connected to both ends of the battery cell 11 to distribute the voltage of the battery cell 11 according to the preset ratio. The voltage distribution unit 110 is connected in parallel with the battery cell 11 so that the voltage of the battery cell 11 is applied across the voltage distribution unit 110 and the voltage of the battery cell 11 is distributed by the multiple resistors included in the voltage distribution unit 110. Herein, the voltage distribution unit 110 is not necessarily connected to one battery cell 11 but may be connected to both ends of the multiple battery cells 11 and may be connected to both ends of the battery module 10.

As shown in FIG. 2, the voltage distribution unit 110 may include a first resistor 111 and a second resistor 112. The first resistor 111 is connected to a positive electrode of the battery cell 11 while the second resistor 112 is connected to a negative electrode of the battery cell 11. The first and second resistors 111 and 112 are connected in series to each other. Accordingly, the voltage of the battery cell 11 is distributed according to a ratio of resistance values of the first and second resistors 111 and 112.

Herein, the first resistor 111 may have a resistance of 75.3 kΩ to 300 kΩ, and preferably 150 kΩ. The second resistor 112 may have a resistance of 86.5 kΩ to 875.6 kΩ, and preferably 437.8 KΩ Increasing the resistances of the first and second resistors 111 and 112 decreases a current $I_4$ flowing through the first and second resistors 111 and 112. A power P consumed by the first and second resistors 111 and 112 may be defined as $P=I^2*(R1+R2)$ obtained by multiplying square of the current $I_4$ by total resistance R1+R2. Accordingly, since the square of the current is multiplied by the total resistance, the magnitude of the current decreases even when the resistances of the resistors increase, so that the power consumed by the first and second resistors 111 and 112 decreases. Thus, in the case where the first resistor 111 has a resistance of 75.3 kΩ to 300 kΩ and the second resistor 112 has a resistance of 86.5 kΩ to 875.6 kΩ, the power consumed by the first resistor 111 and the second resistor 112 decreases, thereby reducing power consumption.

The ratio of the first resistor 111 to the second resistor 112 is determined by the magnitude of the distributed voltage $V_2$ supplied by the voltage distribution unit 110 to the voltage sensing unit 120 and the magnitude of the voltage $V_0$ supplied from the battery cell 11 to the voltage distribution unit 110. For example, when the voltage of the battery cell 11 is $V_0$ and the voltage supplied to the voltage distribution unit 110 is $V_2$, $V_2=V_0*R2/(R1+R2)$ and the ratio of R1 to R2 is summarized as $R1/R2=(V_0-V_2)/V_2$.

The voltage sensing unit 120 compares the distributed voltage $V_2$ with the preset reference voltage $V_R$, and generates a control current $I_3$ when the distributed voltage $V_2$ is equal to or greater than the reference voltage $V_R$. The voltage sensing unit 120 is connected with the voltage distribution unit 110 to receive the distributed voltage $V_2$ of the battery cell 11, and when the distributed voltage $V_2$ is equal to or greater than the reference voltage VR, determines that the battery module 10 is overcharged and generates the control current $I_3$.

Herein, the voltage sensing unit 120 may be a shunt regulator. When the distributed voltage $V_2$ applied to a reference terminal c3 is equal to or greater than the reference voltage $V_R$, the shunt regulator is turned on to allow the control current $I_3$ to flow. The shunt regulator is characterized in that a difference between operating voltages according to the external temperature is considerably smaller than that of a solid state relay (SSR), so that it is possible to increase accuracy of the overcharging prevention circuit 100 by minimizing the difference between operating voltages. The shunt regulator is configured such that a cathode terminal c1 thereof is connected to the positive electrode of the battery cell 11, while an anode terminal c2 thereof is connected to the negative electrode of the battery cell 11 and the reference terminal c3 thereof is connected to a contact between the first resistor 111 and the second resistor 112.

Thus, when the distributed voltage $V_2$ of the battery cell 11 is applied to the reference terminal c3 and the distributed voltage $V_2$ is smaller than the reference voltage $V_R$, that is, when the battery module 10 is in the normal state, the cathode terminal c1 and the anode terminal c2 of the shunt regulator are electrically disconnected from each other as shown in FIG. 3, resulting in the control current $I_3$ being not generated.

On the other hand, when the distributed voltage $V_2$ applied to the reference terminal c3 is equal to or greater than the reference voltage $V_R$, that is, when the battery module 10 is in the overcharged state, the cathode terminal c1 and the anode terminal c2 are electrically connected to each other as shown in FIG. 4, resulting in the control current $I_3$ flowing through the cathode terminal c1 and the anode terminal c2.

For example, when the voltage of the battery cell 11 is equal to or greater than 4.5 V, it may be determined that the battery cell 11 is in the overcharged state. The overcharging prevention circuit 100 may be configured such that the battery cell is determined to be in the overcharge state when the reference voltage $V_R$ is equal to or greater than 2.5 V depending on selection of resistance values the voltage distribution unit 110 and type of low voltage shunt regulator. Alternatively, when the voltage appearing when the battery cell is overcharged is 4.7 V and the reference voltage $V_R$ at which the shunt regulator is turned on is 3.5 V, the first resistor 111 may have a resistance of 150 kΩ and the second resistor 112 may have a resistance of 437.8 kΩ. When the battery cell 11 is overcharged with a voltage of equal to or greater than 4.7 V, the voltage $V_2$ at the contact between the first resistor 111 and the second resistor 112 becomes equal to or greater than 3.5 V, and a voltage of equal to or greater than 3.5 V is applied to the reference terminal c3 of the shunt regulator, so that the shunt regulator is turned on. When the shunt regulator is turned on, the control current $I_3$ flows through the cathode terminal c1 and the anode terminal c2 of the shunt regulator.

The shunt regulator consumes power because the shunt regulator is driven while the battery module 10 is charged to determine whether the battery module 10 is overcharged. A low voltage shunt regulator may be applied to the embodiment of the present invention to reduce the power consumed by the shunt regulator. Herein, the magnitude of the reference voltage $V_R$ of the low voltage shunt regulator may decrease, and accordingly the magnitude of the control current $I_3$ may also decrease. As a result, the decreased control current $I_3$ may be smaller than the second driving current $I_2$ for driving the second relay 140. In this case, even when the control current $I_3$ flows into the second coil 141 of the second relay 140, the second relay 140 is not operated.

For example, the shunt regulator may be the low voltage shunt regulator in which in an Off state, the voltage $V_2$ at the contact between the first resistor 111 and the second resistor 112 is monitored, and in an On state, the control current $I_3$ flowing through the cathode terminal c1 and the anode terminal c2 has a magnitude of 12 mA and a maximum output voltage of the shunt regulator is 10 V.

Accordingly, when it is assumed that the second driving current $I_2$ for driving the second relay 140 has a magnitude of 25 mA, the second relay 140 is not operated even when the control current $I_3$ flowing through the low voltage shunt regulator flows into the second coil 141 of the second relay 140. Thus, in order to apply the low voltage shunt regulator to the overcharging prevention circuit 100, the embodiment of the present invention includes the relay driver 130.

The relay driver 130 generates the second driving current $I_2$, which is greater than the control current $I_3$ and is equal to or greater than the operating current of the second relay 140, using the control current $I_3$. In other words, the relay driver 130 generates a bias voltage $V_3$ using the control current $I_3$, and when the bias voltage $V_3$ is generated, generates and amplifies the second driving current $I_2$ to control operation of the second relay 140.

As shown in FIG. 2, the relay driver 130 may include a third resistor 131 for generating the bias voltage $V_3$ by receiving the control current $I_3$ flowing from the voltage sensing unit 120, and a transistor 132 turned on when the bias voltage $V_3$ is applied to a drive terminal c3 and applies the second driving current $I_2$ to the second coil 141 of the second relay 140.

The third resistor 131 is connected in series with the voltage sensing unit 120 to allow inflow of the control current $I_3$ and generates the bias voltage $V_3$ for driving the transistor 132. A first end e1 of the third resistor 131 is connected to the anode terminal c2 of the shunt regulator while a second end e2 of the third resistor 131 is connected to the negative electrode of the battery cell 11 (see FIG. 2). The control current $I_3$ flowing between the cathode terminal c1 and the anode terminal c2 flows into the third resistor 131, resulting in the bias voltage $V_3$ being generated across the third resistor 131.

The transistor 132 is configured such that a base terminal d3 thereof is connected to the anode terminal c2 of the shunt regulator and the first end e1 of the third resistor 131, while a collector terminal d1 thereof is connected to the second end 141b of the second coil 141 and an emitter terminal d2 thereof is connected to the negative electrode of the battery cell 11 (see FIG. 2). Since the base terminal d3 is connected to the first end e1 of the third resistor 131, the bias voltage $V_3$ is applied to the base terminal d3. When the bias voltage $V_3$ is applied to the base terminal d3, the second driving current $I_2$ is generated and amplified between the collector terminal d1 and the emitter terminal d2.

As shown in FIG. 3, when the battery module 10 is determined to be in the normal state, the control current $I_3$ does not flow into the third resistor 131, so that the bias voltage $V_3$ is not applied to the base terminal d3 of the transistor and the second driving current $I_2$ does not flow between the collector terminal d1 and the emitter terminal d2 of the transistor 132.

However, as shown in FIG. 4, when the shunt regulator that is the voltage sensing unit 120 determines that the battery module 10 is in the overcharged state, the control current $I_3$ flows into the third resistor 131 to generate the bias voltage $V_3$. The generated bias voltage $V_3$ is applied to the base terminal d3 of the transistor 132, thereby generating and amplifying the second driving current $I_2$ flowing from the collector terminal d1 to the emitter terminal d2.

Because the transistor 132 can amplify the magnitude of the current flowing from the collector terminal d1 to the emitter terminal d2 according to the bias voltage $V_3$, the second relay 140 is driven even when the magnitude of the control current $I_3$ of the shunt regulator is small. Thus, even though the low voltage shunt regulator is applied to the embodiment of the present invention, the second relay 140 is driven, resulting in the battery module 10 being prevented from being overcharged.

Herein, the control current $I_3$ may have a magnitude of 1 mA to 25 mA and the second driving current $I_2$ may have a magnitude of 25 mA to 500 mA. In order to minimize the power consumed by the shunt regulator, the magnitude of the control current $I_3$ flowing through the shunt regulator may be determined to be 1 mA to 25 mA and the magnitude of the second driving current $I_2$ may be determined to be 25 mA to 500 mA. In this case, the second driving current $I_2$ is amplified to 25 mA to 500 mA by using the transistor 132, thereby controlling operation of the second relay 140.

For example, in the case where the low voltage shunt regulator is used and the first resistor 111 has a resistance of 150 kΩ and the second resistor 112 has a resistance of 437.8 kΩ, when the battery cell 11 has a voltage of 3.8 V, the current consumed by the overcharging prevention circuit 100 that monitors the battery cell 11 has a magnitude of 39.5 uA, which is a very small value. Thus, by adopting configurations in which the voltage distribution unit 110 has high resistance resistors and the voltage sensing unit 120 is the low voltage shunt regulator, it is possible to minimize power consumption of the battery cell 11. The amount of current consumed by the overcharging prevention circuit 100 may vary depending on the voltage of the battery cell 11.

As shown in FIG. 2, the second relay 140 includes the second coil 141 and the second switch 142. A first end 141a of the second coil 141 of the second relay 140 is connected to the positive electrode of the battery cell 11 while the second end 141b thereof is connected to the collector terminal d1 of the transistor 132. The second switch 142 of the second relay 140 includes first to sixth terminals 142a to 142f, wherein the first terminal 142a is connected to the first end b1 of the first coil 201 of the first relay 200, the second terminal 142b is grounded, and the third terminal 142c is open.

The second relay 140 may be configured of a non-return circuit that maintains an operation state thereof until a separate control is performed. Even when the second relay 140 receives the second driving current $I_2$ applied to cut off the path of the first driving current $I_1$ and then is switched to a state in which the second driving current $I_2$ is not applied, the second relay maintains a state of cutting off the path of the first driving current $I_1$. Thus, the second switch 142 is operated when the second driving current is applied to the second coil 141, so that the second switch 142 is maintained operated until a separate control is performed.

The second relay 140 configured of the non-return circuit cuts off the charging current supplied to the battery module 10 until a separate control is performed, thereby preventing occurrence of additional accidents before a follow-up action regarding battery overcharging occurs. The second relay 140 may be a latching relay element. The latching relay element has a characteristic in that contacts thereof are maintained closed even when the current supplied to the coil is cut off until a separate control is performed. By using the latching relay element, it is not necessary to additionally configure a self-holding circuit for maintaining a state of the contacts of the second relay 140, thereby achieving a reduction in the size, cost, and weight of the relay.

As shown in FIG. 3, because the second driving current $I_2$ does not flow through the second coil 141 of the second relay 140 when the battery module is in the normal state, the first terminal 142a and the second terminal 142b of the second switch 142 are electrically connected to each other. Accordingly, the first driving current $I_1$ generated in the battery management system flows into the first coil 201. As a result, the first switch 202 allows the battery module 10 and the charging module 400 to be electrically connected to each other for battery module charging.

As shown in FIG. 4, when the voltage sensing unit 120 determines that the battery module is in the overcharged state, the transistor 132 is driven and thus the second driving current $I_2$ flows through the second coil 141. The second driving current $I_2$ flows whereby the second switch 142 is operated such that the first terminal 142a and the second terminal 142b are disconnected from each other while the second terminal 142b and the third terminal 142c are connected to each other. Accordingly, the circuit is opened and thus the first driving current $I_1$ of the first relay 200 does not flow, resulting in the first switch 202 of the first relay 200 being opened to cut off a charging path between the battery module 10 and the charging module 400.

Figure 5:
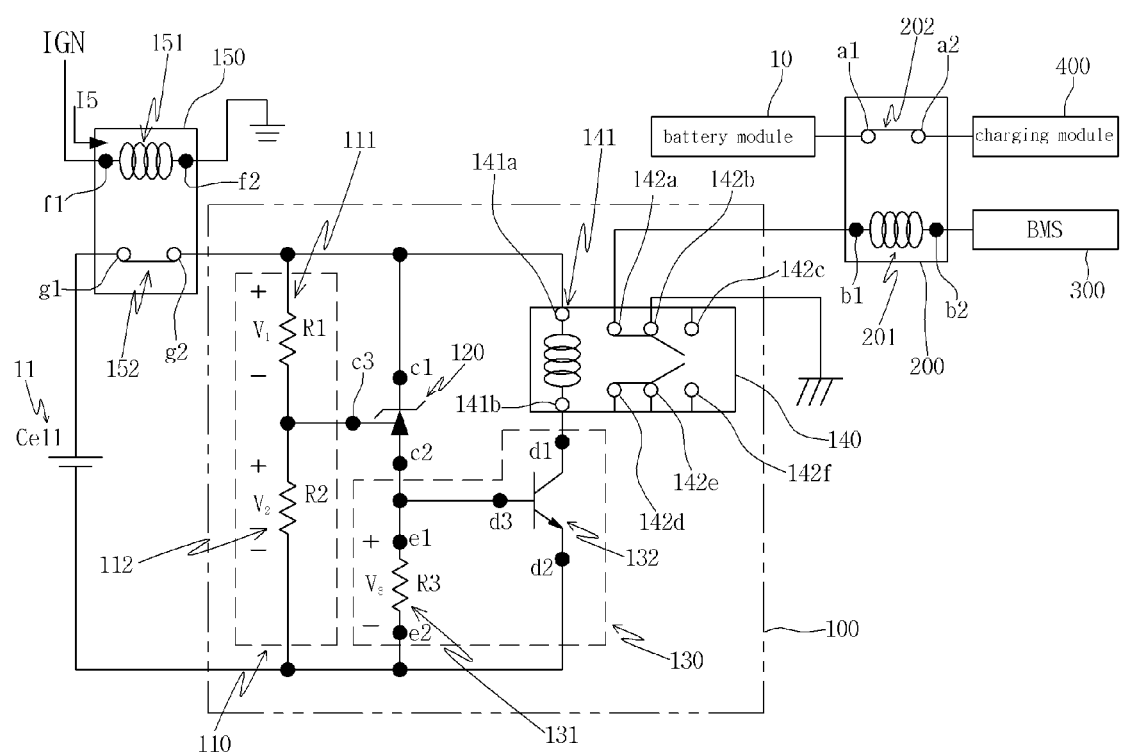
FIG. 5 is a circuit diagram showing the battery overcharging prevention device further including a third relay in FIG. 2.
Figure 6:
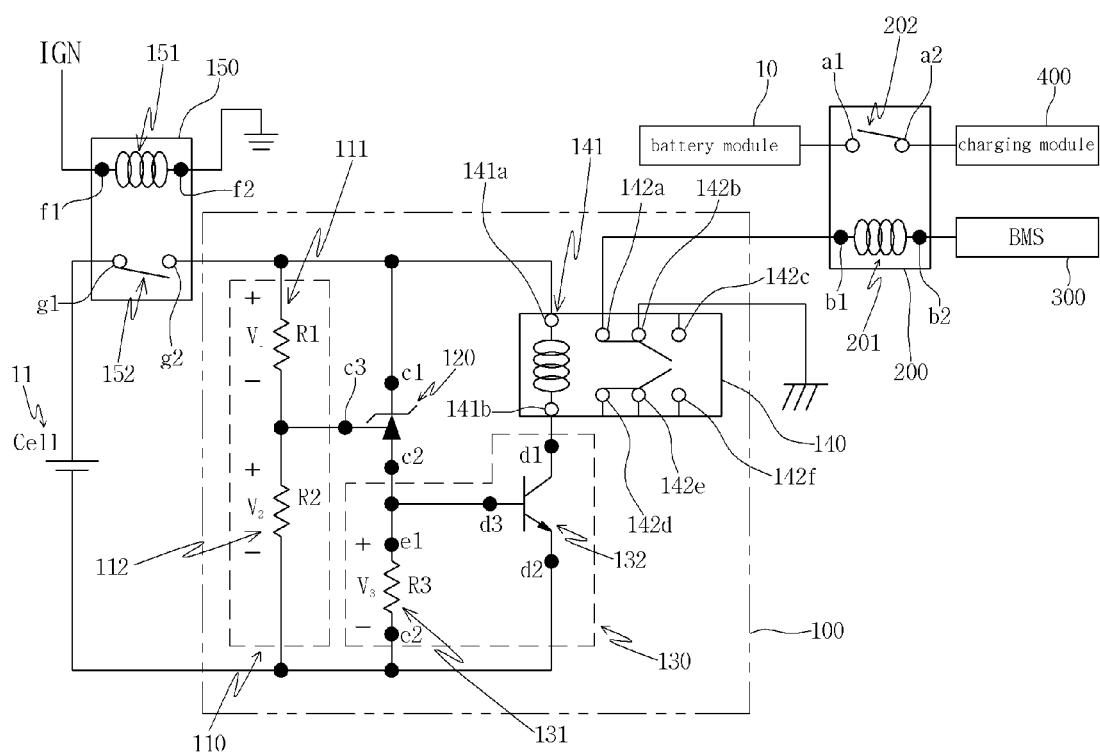
FIG. 6 is a view showing operation of the battery overcharging prevention device shown in FIG. 5.
Figure 7:
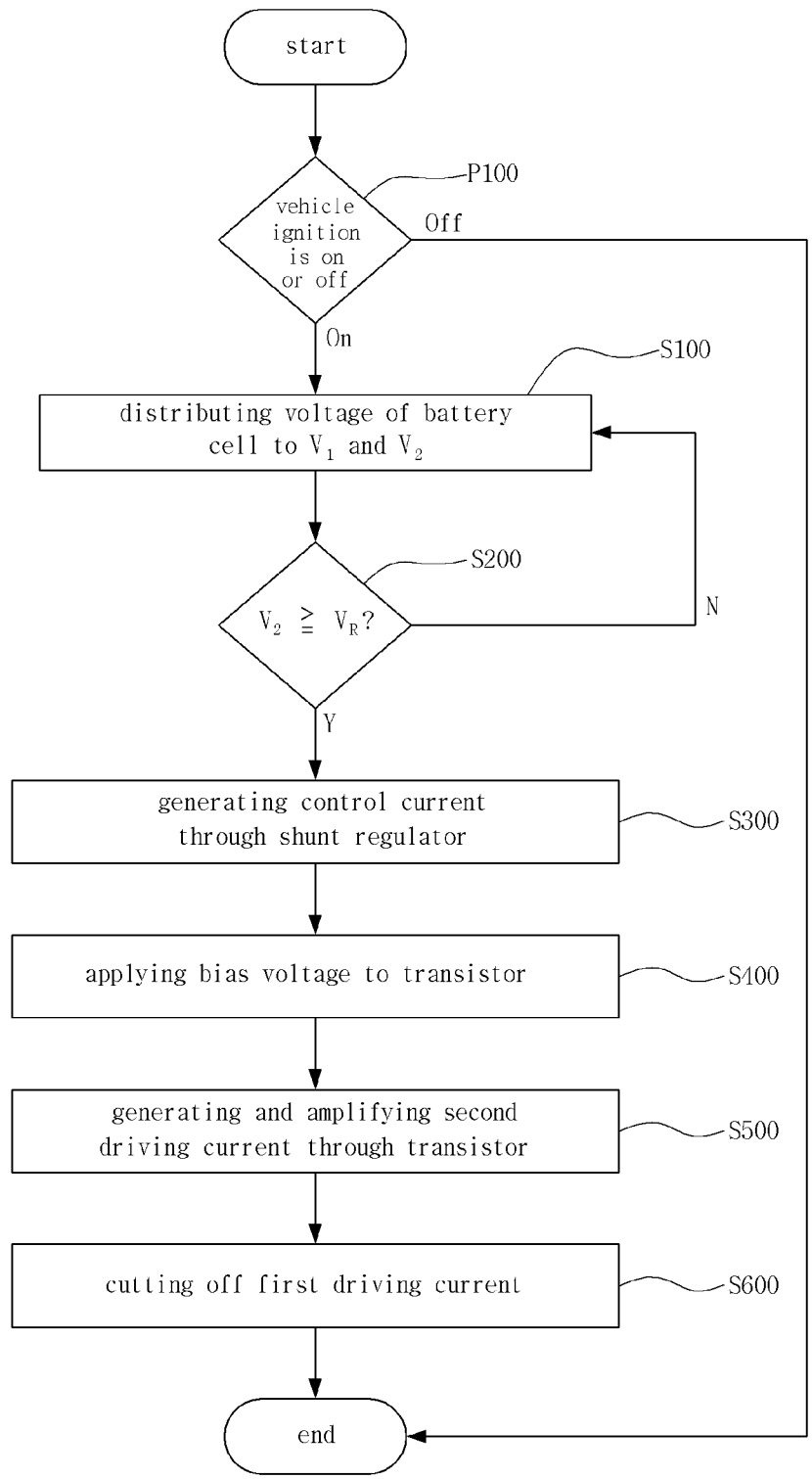
FIG. 7 is a flowchart showing a battery overcharging prevention method according to an embodiment of the present invention.

FIG. 5 is a circuit diagram showing the battery overcharging prevention device further including a third relay in FIG. 2. FIG. 6 is a view showing operation of the battery overcharging prevention device shown in FIG. 5.

As shown in FIG. 5, the battery overcharging prevention device according to the embodiment of the present invention further includes the third relay 150 connected between the battery cell 11 and the overcharging prevention circuit 100 and configured to connect or disconnect the battery cell 11 to or from the overcharging prevention circuit 100 based on an ignition signal $I_S$ applied from a vehicle.

The third relay 150 includes a third coil 151 and a third switch 152. A first end f1 of the third coil 151 is connected to a vehicle's ignition system IGN while a second end f2 thereof is connected to a ground. A first end g1 of the third switch 152 is connected to the positive electrode of the battery cell 11 while a second end g2 thereof is connected to the overcharging prevention circuit 100.

The ignition signal $I_S$ is not applied in an IGN-Off state of a vehicle but is applied in an IGN-On state of the vehicle. As shown in FIG. 5, when the vehicle's ignition system IGN applies the ignition signal $I_S$ to the third relay 150, the ignition signal flows through the third coil 151 and the third switch 152 is closed to connect the battery cell 11 and the overcharging prevention circuit 100 to each other. Accordingly, the overcharging prevention circuit 100 monitors whether the battery cell 11 is overcharged.

As shown in FIG. 6, when the vehicle's ignition system IGN does not apply the ignition signal Is to the third relay 150, the ignition signal Is does not flow through the third coil 151, and the third switch 152 is opened to disconnect the battery cell 11 and the overcharging prevention circuit 100 from each other. Thus, the overcharging prevention circuit 100 does not monitor whether the battery cell 11 is overcharged. Herein, the battery management system (BMS) also stops operating so that the first driving signal $I_1$ is not applied, resulting in the first switch 202 of the first relay 200 being opened as well.

The third relay 150 of which on/off is controlled according to whether the ignition signal $I_S$ is applied from the vehicle's ignition system IGN is connected between the battery cell 11 and the overcharging prevention circuit 100, so that operation of the overcharging prevention circuit 100 is controlled according to whether a vehicle ignition is on or off. In other words, when the vehicle ignition is on, the overcharging prevention circuit 100 monitors overcharging of the battery module 10 while consuming the power of the battery cell 11, whereas when the vehicle ignition is off, the power supplied to the overcharging prevention circuit 100 is cut off, thereby saving the power of the battery cell 11.

When the overcharging prevention circuit 100 is connected to one or several battery cells 11 of the multiple battery cells 11, a difference in the amount of charge, the difference being equal to the amount of power consumed by the overcharging prevention circuit 100, is generated between the battery cell 11 to which the overcharging prevention circuit 100 is connected and remaining battery cells 11 to which the overcharging prevention circuit 100 is not connected. Furthermore, the battery cell 11 connected to the overcharging prevention circuit 100 supplies the power to the overcharging prevention circuit 100, causing deterioration to occur. Accordingly, a difference in degree of deterioration, the difference being equal to the amount of power consumed by the overcharging prevention circuit 100, is generated between the battery cell 11 to which the overcharging prevention circuit 100 is connected and the remaining battery cells 11 to which the overcharging prevention circuit 100 is not connected.

Thus, when the vehicle ignition is off, the third relay 150 disconnects the battery cell 11 and the overcharging prevention circuit 100 from each other, thereby reducing the difference in degree of deterioration occurring between the battery cell 11 to which the overcharging prevention circuit 100 is connected and the remaining battery cells 11 to which the overcharging prevention circuit 100 is not connected. Thus, the battery cell 11 connected to the overcharging prevention circuit 100 is prevented from being deteriorated more rapidly than the remaining battery cells 11, resulting in the entire battery module 10 having an extended lifespan.

Furthermore, when the vehicle ignition is on, the high resistance first and second resistors 111 and 112 and the low voltage shunt regulator are used, thereby reducing power consumption. When the vehicle ignition is off, no power is supplied to the overcharging prevention circuit 100, thereby reducing the power consumed by the overcharging prevention device.

While the first relay 200, the second relay 140, and the third relay 150 have been described based on a relay of a type in which a switch is turned on when a current flows through a coil, a relay of a reverse type in which a switch is turned on when a current does not flow through a coil may also be used. It is to be understood that the type of relay and the change in a high or low level of an operating signal are within the scope of the present invention.

Hereinafter, a description will be given of a battery overcharging prevention method according to an embodiment of the present invention with reference to the drawings. In describing the battery overcharging prevention method, parts overlapping with the above-described battery overcharging prevention device will be omitted or briefly described.

The battery overcharging prevention method according to the embodiment of the present invention includes: a first step of determining whether a battery module 10 is overcharged by using a voltage sensing unit 120 sensing a voltage of a battery cell 11; and a second step of when the battery module 10 is determined to be overcharged, cutting off a connection between the battery module 10 and a charging module 400 by applying a second driving current $I_2$ to a second relay 140 connected to a path of a first driving current $I_1$ applied to a first relay 200 connecting the battery module 10 and the charging module 400 to each other. Hereinbelow, the first and second steps will be described in detail with reference to FIG. 5.

The first step includes: distributing the voltage of the battery cell 11 using multiple resistors connected in series to each other; and sensing, by the voltage sensing unit 120, the distributed voltage $V_2$ of the battery cell 11, and determining that the battery module 10 is overcharged when the distributed voltage $V_2$ of the battery cell 11 is equal to or greater than a preset reference voltage $V_R$.

Specifically explained, in the first step, the voltage of the battery cell 11 is distributed through the multiple resistors connected to both ends of the battery cell 11 (S100). Herein, the multiple resistors are connected in series to each other so that the voltage of the battery cell 11 is distributed according to a ratio of individual resistance values of the resistors.

Next, the distributed voltage $V_2$ of the battery cell is compared with the reference voltage $V_R$ by the voltage sensing unit 120. In this case, the voltage sensing unit 120 may be a shunt regulator, and when the distributed voltage of the battery cell 11 is equal to or greater than the reference voltage (S200), the shunt regulator is turned on to generate a control current $I_3$ flowing between a cathode terminal c1 and an anode terminal c2 (S300).

The second step includes: when the battery module 10 is determined to be overcharged, generating a bias voltage $V_3$ by allowing the control current $I_3$ generated by the voltage sensing unit 120 to flow through a third resistor 131; applying the bias voltage $V_3$ to a base terminal d3 of a transistor 132 to turn on the transistor 132, thereby applying the second driving current $I_2$ to the second relay 140; and operating the second relay 140 to which the second driving current $I_2$ to cut off the path of the first driving current $I_1$ applied to the first relay 200 and opening the first relay 200 to which the first driving current $I_1$ is not applied.

Specifically explained, in the second step, when the battery module 10 is determined to be overcharged, the voltage sensing unit 120 generates the bias voltage $V_3$ across the third resistor 131 using the control current $I_3$ generated when the battery module 10 is determined to be overcharged. Herein, the voltage sensing unit 120 may be the shunt regulator, and the third resistor 131 may be connected in series with the anode terminal c1 of the shunt regulator. Accordingly, the control current $I_3$ flows into the third resistor 131 to generate the bias voltage $V_3$.

Next, when the bias voltage $V_3$ is applied to the base terminal d3 of the transistor 132 (S400), the second driving current $I_2$ is generated between a collector terminal d1 and an emitter terminal d2 of the transistor 132 (S500). Herein, the transistor 132 not only generates and but also amplifies the second driving current $I_2$, so that it is possible to satisfy the magnitude of the current for driving the second relay 140. A second coil 141 of the second relay 140 is connected in series with the collector terminal c1 of the transistor 132 so that the second driving current $I_2$ flows through the second coil 141, resulting the second coil 141 being excited to become an electromagnet. Next, a second terminal 142b and a third terminal 142c of a second switch 142 are connected to each other so that a first terminal 142a and a second terminal 142b thereof are disconnected from each other (S600). This causes the path of the first driving current $I_1$ to be opened so that the first driving current $I_1$ no longer flows through a first coil 201 and a first switch 202 is turned off. Thus, by applying the low voltage shunt regulator to the embodiment of the present invention, even when the magnitude of the control current $I_3$ is small, the second driving current $I_2$ is amplified through the transistor 132 to be supplied to the second relay 140, thereby preventing the battery module 10 from being overcharged.

The battery overcharging prevention method according to the embodiment of the present invention further includes when an ignition signal $I_5$ is applied from a vehicle, allowing the third relay 150 connected between the battery cell 11 and the overcharging prevention circuit 100 to be shorted and when the ignition signal is not applied from the vehicle, allowing the third relay 150 to be opened (P100).

The supplying of power to the overcharging prevention circuit 100 in response to the ignition signal $I_5$ applied from a vehicle (P100) is based on the premise that the above-described first and second steps are performed. This is because when a vehicle's ignition system IGN applies the ignition signal $I_5$ to the third relay 150, the ignition signal flows through a third coil 151 and a third switch 152 is closed to connect the battery cell 11 and the overcharging prevention circuit 100 to each other, so that the overcharging prevention circuit 100 monitors whether the battery cell 11 is overcharged.

Furthermore, when the vehicle's ignition system IGN does not apply the ignition signal $I_5$ to the third relay 150, the ignition signal $I_5$ does not flow through the third coil 151 and the third switch 152 are opened to disconnect the battery cell 11 and the overcharging prevention circuit 100 from each other. Thus, in order to perform the first and second steps, a vehicle ignition must be on.

Furthermore, even when the first step of determining whether the battery module 10 is overcharged is being performed, a connection between the overcharging prevention circuit 100 and the battery cell 11 is cut off when the vehicle ignition is off, so that the above-described first and second steps are not performed.

Although a preferred embodiment of the present invention has been described for illustrative purposes, those skilled in the art will appreciate that various modifications, additions and substitutions are possible, without departing from the scope and spirit of the invention as disclosed in the accompanying claims.

Therefore, the scope of the invention should be determined on the basis of the descriptions in the appended claims, not any specific embodiment, and all equivalents thereof should belong to the scope of the invention.

DESCRIPTION OF THE REFERENCE NUMERALS IN THE DRAWINGS

10: battery module
11: battery cell
100: overcharging prevention circuit
110: voltage distribution unit
111: first resistor
112: second resistor
120: voltage sensing unit 130: relay driver
131: third resistor
132: transistor
140: second relay
141: second coil
142: second switch
142a-142f: first to sixth terminals of second switch
150: third relay
151: third coil
152: third switch
IGN: ignition system of vehicle
200: first relay
201: first coil
202: first switch
300: battery management system
400: charging module
$I_1$: first driving current
$I_2$: second driving current $I_3$: control current
$I_4$: current flowing in voltage distribution unit
$I_5$: ignition signal
$V_R$: reference voltage
$V_1, V_2$: distributed voltage of battery cell
$V_3$: bias voltage

The invention claimed is:

1. A system, comprising:
a battery module including at least one battery cell;
a charging module coupled with the battery module;
a first relay coupled between the battery module and the charging module; and
a battery overcharging prevention device coupled with the battery module;
wherein the battery overcharging prevention device comprises:
a voltage distribution unit coupled to both ends of the at least one battery cell and configured to distribute a voltage of the at least one battery cell according to a preset ratio;
a voltage sensing unit configured to allow a control current to flow when a voltage distributed by the voltage distribution unit is greater than a preset reference voltage; and
a second relay configured to block operation of the first relay by operation of the voltage sensing unit.

2. The system of claim 1,
wherein the second relay further comprises a relay driver generating a driving current which is greater than the control current.

3. The system of claim 2,
wherein the relay driver includes:
a third resistor generating a bias voltage by receiving the control current; and
a transistor generating the second driving current, when turned on by the bias voltage, and applying the second driving current to the second relay;
wherein the second relay is latching relay element, even when the second relay receives the second driving current applied to cut off the path of the first driving current and then is switched to a state in which the second driving current is not applied, the second relay maintains a state of cutting off the path of the first driving current.

4. The system of claim 1,
wherein the voltage distribution unit includes:
a first resistor connected to a positive electrode of the battery cell; and
a second resistor connected to a negative electrode of the battery cell, wherein
the first resistor and the second resistor are connected in series to each other.

5. The system of claim 4,
wherein the first resistor has a resistance of 150 kΩ to 300 kΩ, and the second resistor has a resistance of 86.5 kΩ to 875.6 kΩ.

6. The system of claim 1,
wherein the voltage sensing unit is a shunt regulator that is turned on when the distributed voltage applied to a reference terminal is equal to or greater than the reference voltage to allow the control current to flow.

7. The system of claim 6,
wherein the control current has a magnitude of 1 mA to 25 mA, and the second driving current has a magnitude of 25 mA to 500 mA.

8. The system of claim 1, further comprising:
a third relay connected between the battery cell and the overcharging prevention circuit and connecting or disconnecting the battery cell to or from the overcharging prevention circuit based on an ignition signal applied from a vehicle.

9. The system of claim 8,
wherein the ignition signal is not applied when a vehicle ignition is off but is applied when the vehicle ignition is on.

10. The system of claim 1,
wherein the first relay comprises a first main relay, a second main relay, a pre-charge relay, and a pre-charge resistor,
wherein the first main relay is coupled to a positive terminal of the battery module and the second main relay is coupled to a negative terminal of the battery module, and
wherein the pre-charge relay is coupled in parallel with the first main relay while the pre-charge resistor is coupled in series with the pre-charge relay, and the pre-charge resistor and the pre-charge relay are configured to allow a current output from the battery module to be pre-charged prior to application to the first main relay.

11. The system of claim 1,
wherein the first relay includes:
a first switch having a first end coupled to the battery module, and a second end coupled to the charging module, and
a first coil having a first end coupled to the overcharging prevention circuit, and a second end coupled to a battery management system,
wherein the battery management system monitors a state of the battery module to control generation of a first driving current that flow into the first coil,
wherein the battery overcharging prevention device operates independently from the battery management system irrespective of normal operation or malfunction of the battery management system.

* * * * *